Nov. 14, 1967 D. RENKOWITZ 3,353,117
VARIABLE LINEAR FREQUENCY MULTIVIBRATOR CIRCUIT WITH DISTORTED INPUT VOLTAGE CONTROLLING THE VOLTAGE SENSITIVE FREQUENCY DETERMINING CAPACITOR
Filed March 30, 1965

INVENTOR.
DONALD RENKOWITZ
BY R. J. Frank
ATTORNEY.

United States Patent Office 3,353,117
Patented Nov. 14, 1967

3,353,117

VARIABLE LINEAR FREQUENCY MULTIVIBRATOR CIRCUIT WITH DISTORTED INPUT VOLTAGE CONTROLLING THE VOLTAGE SENSITIVE FREQUENCY DETERMINING CAPACITOR

Donald Renkowitz, Whitestone, N.Y., assignor to General Telephone and Electronics Laboratories, Inc., a corporation of Delaware Filed Mar. 30, 1965, Ser. No. 443,783
7 Claims. (Cl. 331—113)

ABSTRACT OF THE DISCLOSURE

A multivibrator having a voltage variable capacitance coupled between the emitters of the transistors therein for frequency variation is combined with a shaping network which distorts the frequency control voltage supplied to the variable capacitance to provide linear variation of the multivibrator frequency. The transfer characteristic of the shaping network is matched to the voltage-capacitance characteristic of the diode.

This invention relates to a variable frequency multivibrator circuit and more particularly to a multivibrator circuit in which the frequency of the output signal is a linear function of the magnitude of an input signal.

In general, a frequency modulated (FM) signal may be provided by varying the frequency of oscillation of an oscillator generator. One method of generating a wideband frequency modulated signal is to employ two klystron oscillators operating at microwave frequencies. The reflector voltage of one klystron is varied in accordance with a modulating signal while the second klystron is operated at a fixed frequency. The output of the two klystrons is then fed to a heterodyne mixer to produce a relatively low frequency FM output signal.

The use of two klystons has been found to provide reasonably linear modulation. However this method has several disadvantages associated therewith. One such disadvantage is that the stability of the center frequency is found to be generally poor due primarily to the fact that the output frequency is the difference between the relatively high frequencies of the klystrons. Thus, a small undesired variation in one klystron frequency produces a relatively large variation in the center frequency. In addition, klystrons have rather short lives and require high voltage power supplies.

A second method of generating an FM signal in which the frequency is an approximate linear function of the magnitude of an input signal is the use of an inductance-capacitance (LC) oscillator. In this type of oscillator, a voltage variable capacitor is employed as a tuned circuit element. This technique of generating an FM signal substantially eliminates the problems inherent in the method using klystrons but has been found to not provide the desired degree of linearity between the output frequency and the input signal magnitude.

The reasons for the lack of linearity become readily apparent from a consideration of the characteristics of an LC oscillator. The frequency of oscillation, $f$, in general is determined by the following equation $$(1)\qquad f=\frac{1}{2\pi}\frac{1}{\sqrt{LC}}\text{ or }f\alpha\frac{1}{\sqrt{C}}$$

wherein L is the inductance and C is the capacitance of the tuned circuit elements. Thus, it is seen that variations in the capacitance C do not provide a linear response in the frequency of oscillation.

In addition, the relation between voltage and capacitance for a varactor diode or similar variable capacitance device is substantially shown in the following equation $$(2)\qquad C=\frac{1}{\sqrt{V}}$$

wherein V is the voltage applied across the diode. And by applying Equation 2 to Equation 1, the relation between the frequency of oscillation and the applied voltage or input signal magnitude becomes approximately $$(3)\qquad f\alpha\sqrt[4]{V}$$

This relation is found to be an unsatisfactory approximation to a linear function for a reasonable range of variations in the applied voltage. As a result, this type of oscillator is not well suited for wideband frequency modulation.

Accordingly, an object of the present invention is the provision of variable frequency multivibrator in which the frequency of the output signal is a substantially linear function of the amplitude of an input signal.

A further object is the provision of a wideband variable frequency multivibrator in which a voltage variable capacitor is used to vary the frequency of the output signal.

Another object is to provide a wideband variable frequency multivibrator in which the input signal is predistorted to substantially cancel the nonlinearity of the voltage variable capacitor employed therein.

Still another object is to provide a variable frequency multivibrator having a sinusoidal output signal.

In accordance with the present invention, a pair of transistors each having first, second and third electrodes are connected to form a multivibrator circuit. In so doing, the first and second electrodes of each of the transistors are coupled through resistors to a supply voltage source. Also, the first electrode of each transistor is A-C coupled to the second electrode of the other transistor by a large coupling capacitor.

The third electrode of each of the transistors is coupled through a timing resistor to a reference potential. In addition, the third electrodes are coupled together through a voltage variable common coupling capacitor, such as a varactor diode. This circuit operates as an astable multivibrator with the transistors alternately in conduction. The timing action of the circuit, i.e. the period of time during which each transistor remains conductive, is determined primarily by the inverse of the product (RC) of the timing resistor and the capacitance of the varactor diode.

In addition, the output terminal of a matched shaping network is connected to the varactor diode so that the output voltage of the network is applied across the varactor diode. The input signal is applied to the shaping network and the magnitude of the signal is distorted thereby. This distorted signal varies the capacitance of the varactor diode and the output frequency of the multivibrator. The distortion introduced by the shaping network offsets the nonlinearity of the varactor diode so that the circuit enables the output frequency to be varied essentially linearly over a relatively wideband as a function of the magnitude of the input signal. This result is obtained by matching the transfer characteristic of the shaping network to the nonlinear voltage-capacitance characteristic of the varactor diode.

During the operation of the circuit, each transistor alternates between conduction and no conduction. By selecting the transistors such that their cut-off frequency exceeds the desired operating frequency by less than an octave, the voltage appearing across each transistor is essentially sinusoidal. This is due to the fact that the unwanted higher-order harmonic signals are suppressed and do not distort the sinusoidal output waveform.

The operating frequency is dependent on the inverse of the aforementioned RC product. To vary the value of this product, a voltage is applied across the diode from the shaping network. This voltage is a distorted alternating input signal which frequency modulates the operating frequency and advantageously contains a D-C component which biases the varactor diode to a desired operating point. This bias signal is used to set the center frequency or unmodulated output frequency. It has been found preferable to back-bias the varactor diode and minimize the power losses due to the shunt conductance of the diode. The particular bias voltage applied can be maintained by the use of blocking capacitors inserted between the varactor diode and the third electrode of each of said transistors.

Further features and advantages of the invention will become more readily apparent from the following detailed description of a specific embodiment when viewed in conjunction with the accompanying drawings in which.

Figure 1:
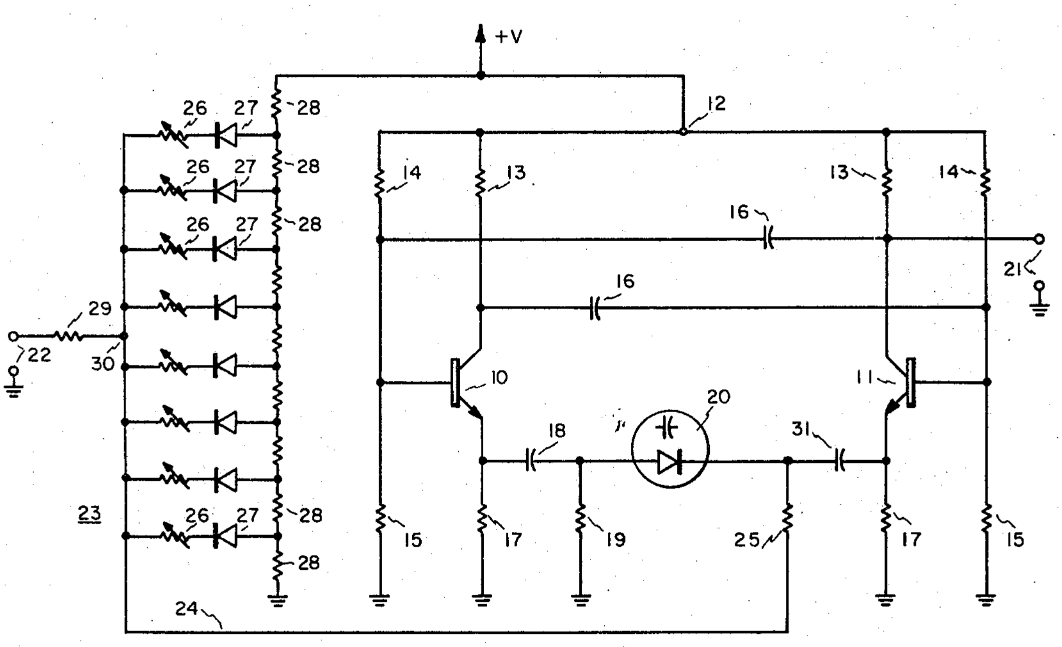
FIG. 1 is a schematic diagram of one embodiment of the invention.

Referring more particularly to the embodiment of FIG. 1, a pair of transistors 10 and 11 having first, second, and third electrodes are shown connected to form an astable multivibrator. As shown and hereinafter referred to, the first, second and third electrodes of transistors 10 and 11 are the collector, base and emitter electrodes respectively.

The collectors of the transistors are connected to terminal 12 through load resistors 13. The transistor bases are also connected to terminal 12 through resistors 14 and to a reference potential through resistors 15. In addition, the base of transistor 10 is A-C coupled to the collector of transistor 11 by coupling capacitor 16. A similar A-C coupling is provided between the base of transistor 11 and the collector of transistor 10. Capacitors 16 are selected to be large so that the coupling path time constant is relatively large with respect to the period of the output signal.

The emitters of transistors 10 and 11 are each coupled to a reference potential, shown herein as ground, through timing resistors 17. Also, the emitters are connected through fixed capacitors 18 and 31 to a voltage variable common coupling capacitor or varactor diode 20. The varactor diode 20 is referenced to ground by resistor 19, which is relatively large compared to resistors 17, provided at one end of the diode.

Terminal 12 is connected to a positive D-C voltage source which provides the power necessary for operation of the multivibrator. The output terminal 21 is connected to the collector of transistor 11 with the output then being taken between the collector of transistor 11 and ground. The operation of a conventional astable multivibrator of this type is described in "Waveforms," Chance et al., MIT Rad. Lab. Series, vol. 19, page 173. Although the described astable multivibrator provides a pulse output waveform, a sinusoidal output may be attained by selecting transistors 10 and 11 so that their cut-off frequencies for the particular circuit configuration employed, shown in FIG. 1 as a common emitter configuration, are less than twice the lowest desired multivibrator frequency. This results in the unwanted harmonic signals being suppressed by the transistors. In practice it has been preferable to select a transistor having a cut-off frequency close to the unmodulated multivibrator frequency.

The input signal to the multivibrator is applied between terminals 22 and is acted upon by shaping network 23 prior to being supplied to varactor diode 20 by coupling lead 24 through resistor 25. Shaping network 23 comprises a plurality of resistors 26, preferably variable, each of which is connected in series with a corresponding diode 27. The diodes in turn are coupled to the connections of a plurality of series resistors 28 which serve as a voltage divider between the voltage source and ground.

Resistors 26 are connected in common to one of the input terminals 22 through resistor 29. The input signal applied at terminals 22 comprises the A-C modulating signal having a D-C level selected to provide the desired center frequency for the multivibrator output signal. This D-C level is preferably chosen such that in the absence of an A-C signal, one-half of the number of diodes 27 are conducting and the other one-half are nonconducting with the voltage at terminal 30 being one-half of the difference between the supply voltage +V and the reference potential or ground. The establishment of the D-C level may be provided either by varying the D-C voltage applied at terminals 22 or by applying a D-C voltage of less than one-half of the difference between the supply voltage and ground and varying resistor 29 so that the D-C voltage at terminal 30 reaches the desired level. It will be noted that if a zero voltage level is desired at terminal 30, the voltage divider should be connected to a −V source rather than ground.

The shaping network distorts the A-C modulating signal applied at terminals 22 in a nonlinear manner. Initially the voltage at terminal 30 is one-half of the supply voltage or *V/2* and those diodes connected to higher voltages on the voltage divider are conductive. For positive excursions of the modulating signal at terminals 22, the number of diodes 27 which are conductive decreases due to back-biasing produced by an increase in voltage at terminal 30. The negative excursions of the modulating signal tend to increase the number of diodes 27 in a conductive state. Each of the diodes 27 operates as a switch to alter the number of conducting paths between terminal 30 and the voltage divider.

Figure 2:
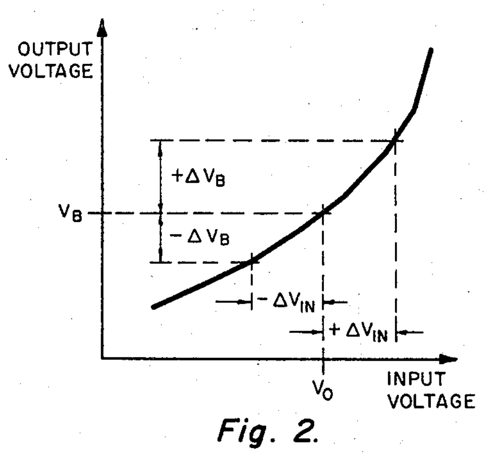
FIG. 2 is a curve showing the transfer characteristic of the shaping network of the embodiment of FIG. 1.

As the number of diodes 27 in conduction decreases, the number of parallel conducting paths decreases and the effective resistance between terminal 30 and the voltage divider increases. The effective resistance determines the increase in voltage at terminal 30 for a given increase in the modulating signal applied at input terminals 22, since the current flowing through resistor 29 is divided between fewer conducting paths. It will be noted that the increase in voltage at terminal 30 is essentially linear with respect to increases in the modulating signal until the next diode is rendered nonconductive. At this point, a linear relation is still obtained although the slope has now increased as shown by the portion of the curve in FIG. 2 lying above the bias voltage $V_B$. By increasing the number of conducting paths between terminal 30 and the voltage divider, the transitions between changes in slope may be made less abrupt.

The operation of the shaping network is similar for the negative excursions of the modulating signals with the slope of the linear relation now decreasing. This is shown by the portion of the curve in FIG. 2 residing below the bias voltage $V_B$. The resultant transfer characteristic of input voltage to output voltage is nonlinear with the positive excursions, $+\Delta V_{in}$, of the modulating or input signal being increased and the negative excursions, $-\Delta V_{in}$, being decreased, as shown by the unequal output voltage variations, $\pm\Delta V_B$. If the polarity of the diodes in the shaping network and the reference voltage are reversed, the polarity of the diode 20 should also be reversed and the input voltage of FIG. 2 will then be taken as representing signal magnitude.

Since the shaping network does not rely on the shape of the individual diode characteristic, but only upon their on-off voltages, the network exhibits temperature stability. It has been found advantageous to make resistors 26 variable in order to compensate for any difference in diode switching voltages. Otherwise, resistors 26 are of equal magnitude.

Figure 3:
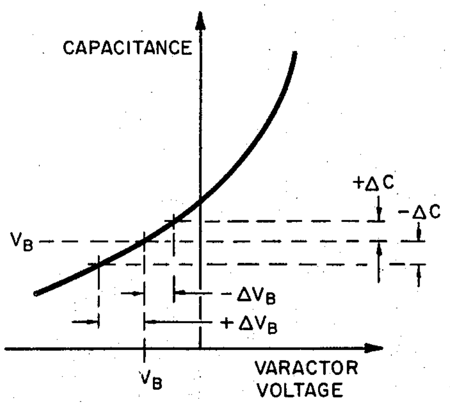
FIG. 3 is a curve showing the voltage-capacitance characteristic of a varactor diode.

The output voltage is coupled to varactor diode 20 by lead 24 through current limiting resistor 25. The voltage-capacitance characteristic of the diode is shown in FIG. 3 to be nonlinear. The bias voltage, $V_B$, determines the unmodulated operating point on the diode characteristic since it initially determines the capacitance of the diode. The frequency of the output signal of the astable multivibrator is determined substantially by the inverse of the RC product of resistor 17 and varactor diode 20. It will be noted that large coupling capacitors 16 provide a large time constant for the coupling path so that the output frequency is essentially independent thereof. Thus, the bias voltage fixes the center frequency of the circuit. Although a zero bias might be employed, it has been found that a negative voltage or back bias decreases the power loss of the varactor diode.

The output of shaping network 23 is applied across diode 20 and resistor 19 so that the positive excursions, $+\Delta V_B$, tend to increase the back bias and vice versa. This is shown in FIG. 3 wherein $+V_B$ decreases the varactor bias voltage and lowers the capacitance thereof. By selecting the transfer characteristic of the shaping network to match the varactor diode characteristic, the capacitance of the diode is varied substantially linearly by the modulating signal applied to input terminals 22, as shown by the variations in capacitance $\pm\Delta C$.

Figure 4:
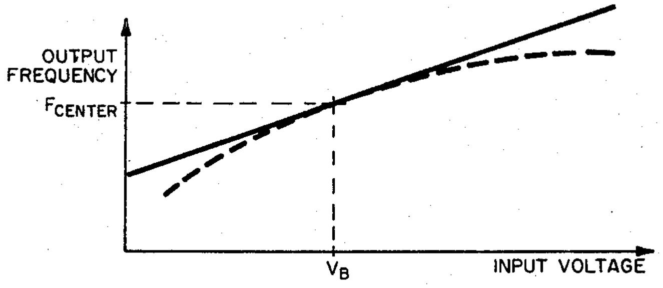
FIG. 4 shows the linear relation of output frequency to input voltage for the embodiment of FIG. 1.

This linear variation in capacitance provides frequency modulation of the output signal appearin at terminals 21 which is a linear function of the amplitude of the input signal at terminals 22. This linear frequency modulation is shown by the solid curve of FIG. 4 wherein the input voltage versus output frequency characteristic of the multivibrator circuit is shown. The operating point is denoted by the bias voltage $V_B$. The dashed curve shows the frequency response of the circuit without the use of shaping network and points out the increasing nonlinearity for wideband frequency modulation.

In one embodiment tested and operated at a center frequency of 70 mc., the frequency response was found to be linear for frequency deviations of ±5mc. The types and values of the components, used in conjunction with a voltage source of +15 volts and a pair of 2N1493 transistors having a cut-off frequency of about 50 mc., were as follows:

| | | |
|---|---|---|
| Varactor diode **20** | Type | PC114 |
| Diodes **27** | Type | 1N903 |
| Resistors **29, 19** | ohms | 1,000 |
| Resistors **28** | do | 20 |
| Resistors **14** | do | 3,300 |
| Resistors **15** | do | 7,500 |
| Resistors **13** | do | 47 |
| Resistors **17** | do | 270 |
| Resistor **25** | do | 10,000 |
| Resistors **26** | do | 3,000 |
| Capacitors **16, 18** | picofarads | 1,000 |
| Capacitor **31** | do | 180 |

As many changes could be made in the above construction and many different embodiments could be made without departing from the scope thereof, it is intended that all matter contained in the above description or shown in the accompanying drawings should be interpreted as illustrative and not in a limiting sense.

What is claimed is:

1. A variable frequency multivibrator of the type wherein the frequency of the output signal is varied in accordance with an input signal which comprises:

(a) a pair of transistors having first, second and third electrodes;

(b) means for coupling the second electrode of each of said pair of transistors to the first electrode of the other of said pair of transistors;

(c) a pair of timing resistors each of which is coupled to the third electrode of one of said pair of transistors;

(d) means for coupling a voltage source across each said transistor and the corresponding timing resistor;

(e) means for coupling the second electrodes of said transistors to a reference potential;

(f) a nonlinear capacitor coupled to the third electrodes of said transistors, the frequency of the output signal of the multivibrator being determined substantially by said timing resistors and said capacitor; and (g) a shaping network having an input and an output for distorting an input signal to offset the nonlinearity of said capacitor, the output of said shaping network being coupled to said capacitor so that the application of an input signal to said shaping network provides a substantially linear variation in the frequency of said multivibrator.

2. A variable frequency multivibrator of the type wherein the frequency of the output signal is varied in accordance with an input signal which comprises:

(a) a pair of transistors having first, second and third electrodes;

(b) means for coupling the second electrode of each of said pair of transistors to the first electrode of the other of said pair of transistors;

(c) a pair of load resistors each of which is coupled to the first electrode of one of said pair of transistors;

(d) a pair of timing resistors each of which is coupled to the third electrode of one of said pair of transistors;

(e) means for coupling a voltage across the series combinations of said load resistor, transistor, and timing resistor;

(f) means for coupling the second electrode of each of said transistors to a reference potential;

(g) a voltage variable capacitor coupled between the third electrodes of said transistors, said capacitor having a nonlinear voltage-capacitance characteristic, the frequency of the output signal of the multivibrator being determined substantially by said timing resistors and the capacitance of said variable capacitor; and (h) a shaping network coupled to said variable capacitor and having a transfer characteristic substantially matched to that of said capacitor, the application of an input signal to said shaping network producing a substantially linear variation in the frequency of the output signal of said multivibrator.

3. A variable frequency multivibrator in accordance with claim 2 in which each of said pair of transistors has a cut-off frequency of less than twice the lowest multivibrator output frequency.

4. A variable frequency multivibrator of the type wherein the frequency of the output signal is modulated in accordance with an input signal which comprises:

(a) a pair of transistors having first, second and third electrodes;

(b) means for coupling the second electrode of each of said pair of transistors to the first electrode of the other of said pair of transistors;

(c) means for coupling the first and second electrodes of said transistors to a voltage source;

(d) a pair of timing resistors each of which is coupled to the third electrode of one of said pair of transistors and to a reference potential;

(e) a voltage variable capacitor having a nonlinear voltage-capacitance characteristic coupled between the third electrodes of said transistors, the frequency of the output signal of the multivibrator being determined substantially by said timing resistors and said capacitor;

(f) means coupled between said third electrodes and said capacitor for maintaining a bias on said capacitor;

(g) a resistor coupled to one end of said variable capacitor and to said reference potential; and (h) a shaping network having an input and an output for distorting an input signal thereto to offset the nonlinearity of said capacitor, said output being coupled to said capacitor to provide bias thereto and modulate the frequency of the multivibrator output signal substantially linearly in accordance with the input signal to said shaping network.

5. A variable frequency multivibrator of the type wherein the frequency of the output signal is modulated in accordance with an input signal which comprises:

(a) a pair of transistors having first, second and third electrodes, each of said transistors having a cut-off frequency of less than twice the lowest multivibrator output frequency, (b) means for coupling the second electrode of each of said pair of transistors to the first electrode of the other of said pair of transistors;

(c) means for coupling the first and second electrodes of said transistors to a voltage source;

(d) a pair of timing resistors each of which is coupled to the third electrode of one of said pair of transistors and to a reference potential;

(e) a voltage variable capacitor having a nonlinear voltage-capacitance characteristic coupled between the third electrodes of said transistors, the frequency of the output signal of the multivibrator being determined substantially by said timing resistors and said capacitor;

(f) means coupled between said third electrodes and said capacitor for maintaining a bias on said capacitor;

(g) a resistor coupled to one end of said variable capacitor and to said reference potential; and (h) a shaping network coupled to said variable capacitor and having a transfer characteristic substantially matched to the voltage-capacitance characteristic of said capacitor, the application of an input signal to said shaping network producing a substantially linear variation in the frequency of the output signal of said multivibrator.

6. Apparatus in accordance with claim 5 in which said shaping network comprises:

(a) a voltage divider having a voltage gradient along the length thereof;

(b) a plurality of diodes coupled to said voltage divider at different voltages thereon, said diodes being poled to be conductive with respect to the divider voltage;

(c) a plurality of resistors each of which is coupled in series to one of said diodes, said resistors being coupled to form a common output; and (d) an input resistor coupled between said common output and the shaping network input so that a signal applied to the shaping network input is distorted in accordance with the transfer characteristic thereof.

7. A variable frequency multivibrator in accordance with claim 6 in which said transistors have a cut-off frequency approximately equal to the unmodulated multivibrator output frequency.

No references cited.

ROY LAKE, *Primary Examiner.*

J. KOMINSKI, *Assistant Examiner.*